United States Patent
Noguchi et al.

(10) Patent No.: US 7,105,880 B2
(45) Date of Patent: Sep. 12, 2006

(54) ELECTRONIC DEVICE AND METHOD OF FABRICATING THE SAME

(75) Inventors: Takao Noguchi, Tokyo (JP); Kenji Inoue, Tokyo (JP); Hisatoshi Saito, Tokyo (JP)

(73) Assignee: TDK Corporation, (JP)

(*) Notice: Subject to any disclaimer, the term of this patent is extended or adjusted under 35 U.S.C. 154(b) by 0 days.

(21) Appl. No.: 11/069,723

(22) Filed: Feb. 28, 2005

(65) Prior Publication Data
US 2005/0194626 A1   Sep. 8, 2005

(30) Foreign Application Priority Data
Mar. 5, 2004   (JP) .............. 2004-062162

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/295; 257/E21.208; 438/3

(58) Field of Classification Search .......... 257/295, 257/E21.208; 438/3; 310/320; 333/191
See application file for complete search history.

(56) References Cited

U.S. PATENT DOCUMENTS

| | | | |
|---|---|---|---|
| 6,278,150 B1 * | 8/2001 | Okudaira et al. | 257/306 |
| 6,290,736 B1 * | 9/2001 | Evans | 51/307 |
| 6,475,931 B1 | 11/2002 | Bower et al. | |
| 6,524,932 B1 * | 2/2003 | Zhang et al. | 438/459 |
| 6,728,093 B1 * | 4/2004 | Fox | 361/303 |
| 6,911,689 B1 * | 6/2005 | Hsu et al. | 257/306 |

FOREIGN PATENT DOCUMENTS

| | | |
|---|---|---|
| JP | 3310881 | 4/1997 |
| JP | 11-312801 | 11/1999 |
| JP | 2001-313535 | 11/2001 |

\* cited by examiner

*Primary Examiner*—Evan Pert
*Assistant Examiner*—Victor A. Mandala, Jr.
(74) *Attorney, Agent, or Firm*—Young Law Firm, P.C.

(57) ABSTRACT

The electronic device includes a substrate, a lower conductive film provided on the substrate, a functional film provided on the lower conductive film, and a crystallinity barrier film provided between the lower conductive film and the functional film. The present invention prevents the crystallinity of the functional film being affected by the crystallinity or the material selection of the lower conductive film, so it becomes possible to use a low-cost metal such as aluminum (Al) for the lower conductive film, and to use a low-cost method for forming the film, thereby making it possible to improve the crystallinity of the functional film without using a costly film-formation method such as epitaxial growth. For the crystallinity barrier film, there can be used a material having an amorphous structure.

19 Claims, 4 Drawing Sheets

ELECTRONIC DEVICE AND METHOD OF FABRICATING THE SAME

TECHNICAL FIELD

The present invention relates to an electronic device and a method of fabricating the electronic device, particularly to an electronic device that includes a ferroelectric or piezoelectric functional film such as a film capacitor, ferroelectric nonvolatile memory, or film bulk acoustic wave resonator or the like, and to a method of fabricating the device.

BACKGROUND OF THE INVENTION

Functional films composed of ferroelectric material or piezoelectric material are used in some electronic devices such as film capacitors, ferroelectric nonvolatile memories, film bulk acoustic wave resonators and the like. A film bulk acoustic wave resonator, for instance, is configured by sandwiching a functional film made of a piezoelectric material between an upper conductive film and a lower conductive film. The film bulk acoustic wave resonator operates as a high-frequency filter when a high-frequency signal is applied across the two conductors.

To achieve good device characteristics in such an electronic device, it is necessary to enhance the crystallinity of the functional film. A method of improving the crystallinity of the lower conductive film that is generally employed is to improve the crystallinity of the lower conductive film and have that crystallinity reflected in the crystallinity of the functional film. For example, U.S. Pat. No. 6,475,931 and Japanese Patent Application Laid Open No. 2001-313535 teach a method in which the X-ray rocking curve full width at half maximum (FWHM) of the lower conductive film is made to be not greater than 4.5 degrees, and by reflecting that crystallinity, a functional film X-ray rocking curve FWHM of not more than 3.5 degrees is achieved. JP 3,310,881 and Japanese Patent Application Laid Open No. 11-312801 also describe methods of forming a lower conductive film having good crystallinity.

However, in order to have the crystallinity of the lower conductive film adequately reflected in the functional film, it is necessary to use a costly method of growing the film, such as, for example, epitaxial growth. Moreover, with an epitaxial growth method, the film growth rate is relatively low, so low productivity is a problem when the method is used to form functional films.

Furthermore, to have the crystallinity of the lower conductive film reflected in the crystallinity of the functional film, it is also necessary to form the lower conductive film of expensive materials having high crystal matching to the functional film, such as, for example, platinum (Pt) and iridium (Ir), so the high cost of the materials becomes a problem. The crystallinity of the lower conductive film is also not reflected in the functional film if the lower conductive film has a high surface roughness, so in some cases it is necessary to smooth the surface of the lower conductive film by polishing or the like.

SUMMARY OF THE INVENTION

It is therefore an object of the present invention to provide an electronic device in which the crystallinity of the functional film can be improved regardless of the crystallinity of the lower conductive film.

Another object of the present invention is to provide a method of fabricating the electronic device that enables the formation of a functional film having high crystallinity without using a costly film formation method such as epitaxial growth.

The electronic device according to the present invention comprises a substrate, a lower conductive film provided on the substrate, a functional film provided on the lower conductive film, and a crystallinity barrier film provided between the lower conductive film and the functional film.

The provision of a crystallinity barrier film between the lower conductive film and the functional film, in accordance with this invention, prevents the crystallinity of the functional film being affected by the crystallinity or the material selection of the lower conductive film. Therefore, it becomes possible to use a low-cost metal such as aluminum (Al) for the lower conductive film, and to use a low-cost method for forming the film, thereby making it possible to improve the crystallinity of the functional film without using a costly film-formation method such as epitaxial growth. As a consequence, it becomes possible to a functional film having an X-ray rocking curve FWHM that is not more than 3 degrees, even when the lower conductive film has an X-ray rocking curve FWHM of, for example, 5 degrees or more, and a surface roughness of 15 Å or more.

In the present invention, it is preferable to constitute the crystallinity barrier film of a material having an amorphous structure. More preferably, the crystallinity barrier film should be composed of a material containing at least one element selected from among silicon (Si), oxygen (O) and nitrogen (N) or amorphous silicon, since such a material is low in cost and can readily form a film.

In the present invention, it is also preferable for the crystallinity barrier film to be not less than 50 nm thick and not thicker than the functional film. A crystallinity barrier film that is within that thickness range can block the crystallinity of the lower conductive film while reducing the effect on the characteristics of the electronic device, while at the same time covering irregularities in the surface of the lower conductive film. More preferably, the crystallinity barrier film should be not less than 150 nm thick. Setting the thickness of the crystallinity barrier film at 150 nm or more makes it possible to substantially perfectly block the crystallinity of the lower conductive film while ensuring that surface irregularities in the lower conductive film are covered. It is also more preferable for the thickness of the crystallinity barrier film to be not more than half the thickness of the functional film. That makes it possible to further reduce the effect on the characteristics of the electronic device.

The method of fabricating an electronic device according to the present invention comprises a step of forming a lower conductive film on a substrate, a step of forming a crystallinity barrier film having an amorphous structure on the lower conductive film and a step of forming a functional film on the crystallinity barrier film. It is preferable to use sputtering to form the lower conductive film, crystallinity barrier film and functional film.

Thus, since in accordance with the present invention the crystallinity of the functional film is not affected by the crystallinity or material selection of the lower conductive film, it is possible to use a low-cost metal, and a low-cost formation method, for the lower conductive film. As a result, it is possible to provide a low-cost, high-performance electronic device.

BRIEF DESCRIPTION OF THE DRAWINGS

The above and other objects, features and advantages of this invention will become more apparent by reference to the following detailed description of the invention taken in conjunction with the accompanying drawings.

DETAILED DESCRIPTION OF THE EMBODIMENTS

Preferred embodiments of the present invention will now be explained in detail with reference to the drawings.

Figure 1:
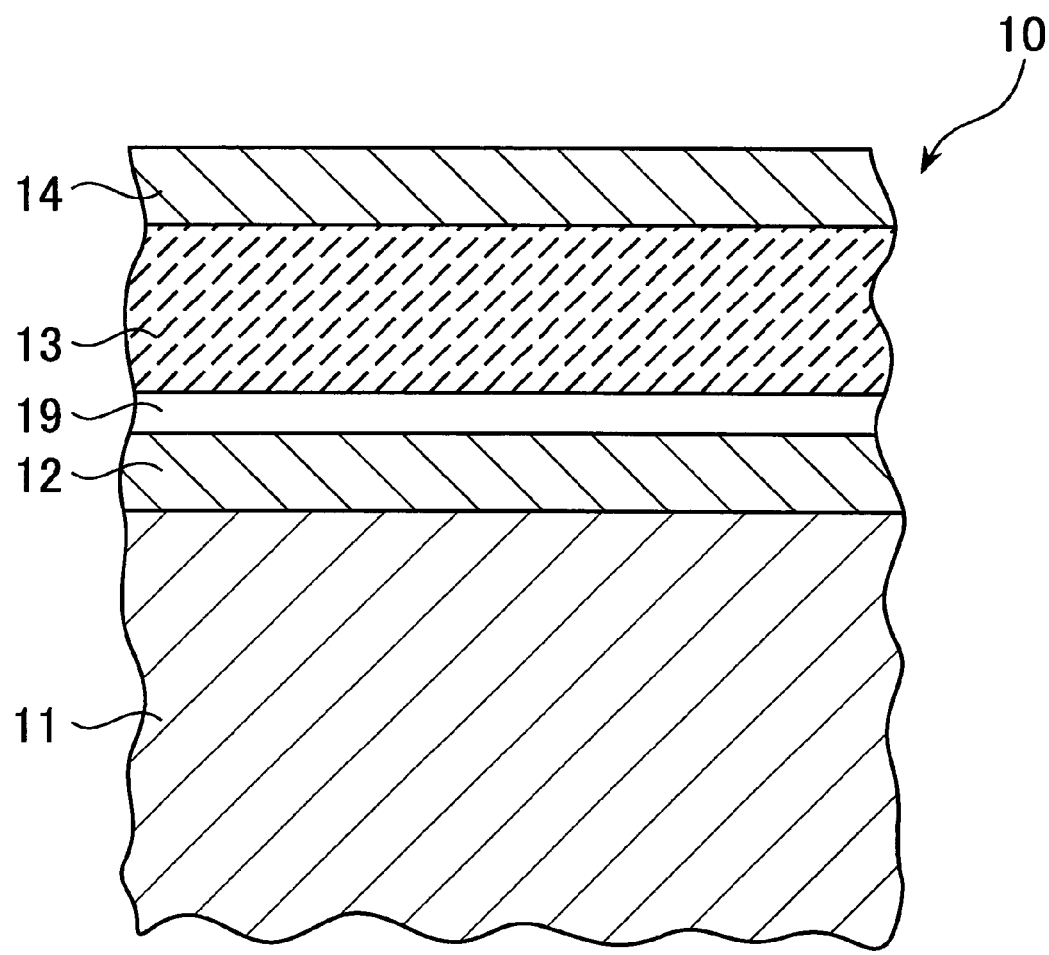
FIG. 1 is a simplified sectional view showing the structure of an electronic device that is a preferred embodiment of the present invention.

FIG. 1 is a simplified sectional view showing the structure of an electronic device 10 that is a preferred embodiment of the present invention.

As shown in FIG. 1, the electronic device 10 of this embodiment includes a substrate 11, a lower conductive film 12 formed on the substrate 11, a functional film 13 formed on the lower conductive film 12, an upper conductive film 14 formed on the functional film 13, and a crystallinity barrier film 19 provided between the lower conductive film 12 and the functional film 13. The electronic device 10 of this embodiment thus has a structure in which the functional film 13 is sandwiched between the lower conductive film 12 and the upper conductive film 14. Therefore, if a piezoelectric material such as ZnO is used as the material of the functional film 13, the electronic device 10 can be used as a film bulk acoustic wave resonator, ink-jet printer head or the like, while if a ferroelectric material such as PZT is used as the functional film 13, it can be used as a ferroelectric nonvolatile memory, film capacitor or the like. Moreover, by combining such an electronic device 10 with other circuitry, it becomes possible to configure various electronic devices such high-frequency filters, duplexers, and integrated semiconduct or circuits with built-in RF section for telecommunication applications.

Thus, in the electronic device of this invention, a crystallinity barrier film 19 is provided between the lower conductive film 12 and the functional film 13, whereby the crystallinity of the lower conductive film 12 does not reflect the crystallinity of the functional film 13. The significance of this is that it eliminates the need, seen in the prior art, to improve the crystallinity of the lower conductive film 12 and use for the lower conductive film 12 a material having a high crystal matching with respect to the functional film 13, and also eliminates the need to improve the surface smoothness of the lower conductive film 12 by polishing or the like. Therefore, in addition to making it possible to form the lower conductive film 12 economically, it eliminates the need to use the epitaxial growth method to form the functional film 13, making it possible to also form the functional film 13 economically.

The constituent elements of the electronic device 10 will now be explained in detail.

Substrate 11

As the substrate 11 can be used, for example, a single crystal substrate of silicon (Si), sapphire or the like, a ceramic substrate of alumina, AlTiC or the like, or a quartz or glass substrate. The material of the substrate 11 can be suitably selected taking into account the processes to be used, the desired characteristics of the device, cost and other considerations. For example, when silicon (Si) or glass is used as the material of the substrate 11, an electronic device substrate of low cost can be obtained, while when a high-temperature process conducted at a temperature exceeding 600° C. is required, silicon (Si) or quartz is preferably used. The most preferable material for the substrate 11 is Si single crystal, which is advantageous from the points of low cost and the availability of sophisticated wafer processes.

It is possible to use as the substrate 11 one whose surface has been pre-formed with some kind of film or been subjected to polishing or other such mechanical processing. Most industrial purpose substrates, especially those made of silicon (Si), have been subjected to polishing or other mechanical processing before marketing. On the other hand, some ceramic substrates are pre-formed with a surface film, which itself may be polished, in order to reduce surface roughness. All such substrates are usable in the present invention.

Figure 2:
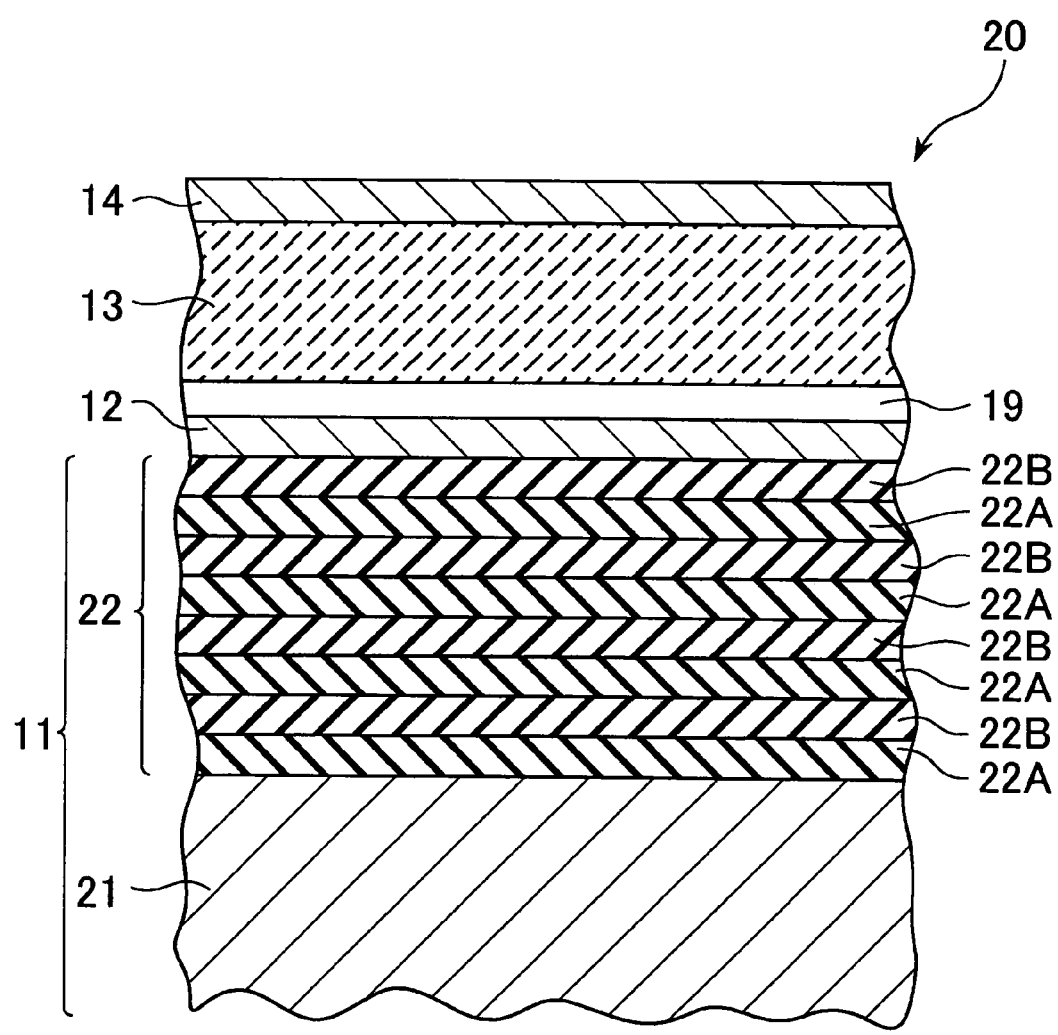
FIG. 2 is a simplified sectional view of an electronic device using a substrate composed of a substrate body and a acoustic multilayer formed on the surface thereof.

FIG. 2 is a simplified sectional view of an electronic device 20 using a substrate 11 composed of a substrate body 21 and an acoustic multilayer 22 formed on the surface thereof. This structure is suitable for an invention electronic device for use as a film bulk acoustic wave resonator.

As the substrate 21 can be used, for example, a single crystal substrate of silicon (Si), sapphire or the like, a ceramic substrate of alumina, AlTiC or the like, or a quartz or glass substrate. The acoustic multilayer 22 is constituted of alternately stacked reflective films 22A and 22B made of different material from each other. These layers enhance the characteristics of the film bulk acoustic wave resonator by reflecting vibration propagating toward the substrate body 21. The material used for the reflective films 22A can, for example, be aluminum nitride (AlN) and the material used for the reflective films 22B can, for example, be silicon oxide ($SiO_2$). When made of aluminum nitride (AlN), the reflective films 22A are preferably formed by sputtering. When made of silicon oxide ($SiO_2$), the reflective films 22B are preferably formed by CVD. The thickness of the reflective films 22A and 22B can be defined as appropriate for the desired resonant frequency.

Lower Conductive Film 12

The lower conductive film 12 is disposed on the lower side of the functional film 13. As described above, in the electronic device of the present invention, the crystallinity barrier film 19 is provided between the lower conductive film 12 and the functional film 13, so the crystalline structure or crystallinity of the lower conductive film 12 does not affect the crystallinity of the functional film 13. As such, any material having a high conductivity can be used for the lower conductive film 12, and the lower conductive film 12 can have an X-ray rocking curve FWHM of 5 degrees or more, or even 10 degrees or more. Although there is no particular limitation on the material of the lower conductive film 12, it is preferable to use a low-cost metal such as aluminum (Al) or copper (Cu), or an alloy thereof. Also, there is no particular need to smooth the surface of the lower conductive film 12, which can have a surface roughness of from 15 Å to around 30 Å, for example. That is, there is no need to smooth the surface of the lower conductive film 12 by polishing or the like.

The thickness of the lower conductive film 12 is preferably 10 to 1000 nm, more preferably 50 to 300 nm. This is because the lower conductive film 12 becomes inappropriate as an electrode owing to large sheet resistance when thinner than 10 nm, while the production process time and material cost become unnecessarily large when it is thicker than 1000 nm. Moreover, when the electronic device of this embodiment is used as a film bulk acoustic wave resonator, its resonant frequency varies with the thickness of the lower conductive film 12, so that the thickness of the lower conductive film 12 is preferably set based on the desired resonant frequency. The lower conductive film 12 is preferably formed by vacuum deposition, sputtering or CVD.

Crystallinity Barrier Film 19

The crystallinity barrier film 19 is used to prevent the crystallinity of the lower conductive film 12 being reflected in the functional film 13. It is desirable for the film to be formed of a material having an amorphous structure, since that ensures that the crystallinity of the lower conductive film 12 is not reflected in the functional film 13. Preferably, the amorphous material is one that includes at least silicon (Si) or oxygen (O), such as silicon oxide ($SiO_2$), silicon nitride ($Si_3N_4$) and silicon oxynitride (SiON, element ratio undefined), or amorphous silicon. These materials are low-cost and can readily be formed into films.

It is preferable for the crystallinity barrier film 19 to be not less than 50 nm thick. If the crystallinity barrier film 19 is less than 50 nm thick, it will not have an adequate crystallinity blocking effect and will also be unable to adequately cover irregularities in the surface of the lower conductive film 12. To ensure a substantially perfect blocking of the crystallinity of the lower conductive film 12 and adequate covering of surface irregularities in the lower conductive film 12, preferably the crystallinity barrier film 19 should be not less than 150 nm thick.

Because the crystallinity barrier film 19 is provided between the lower conductive film 12 and the upper conductive film 14, if it is too thick it can have a major effect on the characteristics of the electronic device. That being the case, preferably the crystallinity barrier film 19 should not be thicker than the functional film 13, and more preferably should not be more than half the thickness of the functional film 13. In particular, when silicon oxide ($SiO_2$) or silicon nitride ($Si_3N_4$) is used as the material of the crystallinity barrier film 19, the effect of the crystallinity barrier film 19 reaches more or less saturation when the film thickness exceeds 150 nm, so the thickness of the crystallinity barrier film 19 is more preferably set not less than 150 nm thick and set close to 150 nm.

Functional Film 13

Materials usable for the functional film 13 include piezoelectric materials of wurtzite crystal structure such as ZnO, AlN or GaN and ferroelectric materials such as PZT. When an piezoelectric material such as ZnO is used as the material of the functional film 13, for example, the electronic device 10 of this embodiment can be used as a film bulk acoustic wave resonator, ink-jet printer head or other such electronic device, while if a ferroelectric material such as PZT is used as the functional film 13, the electronic device 10 of this embodiment can be used as a ferroelectric nonvolatile memory, film capacitor or other such electronic device.

The X-ray rocking curve FWHM of the functional film 13 is preferably not greater than 3 degrees. The X-ray rocking curve FWHM of the functional film 13 can be controlled to such a value by, as explained earlier, using the crystallinity barrier film 19 made of the amorphous material and its thickness should be set not less than 50 nm, preferably not less than 150 nm. This enables fabrication of an electronic device having good characteristics.

When the functional film 13 is made of a piezoelectric material of wurtzite crystal structure such as AlN or ZnO, it is preferably formed by a sputtering method such as RF magnetron sputtering, DC sputtering or ECR sputtering, CVD (chemical vapor deposition), or vacuum deposition. Among these, it is preferable to use a sputtering method, particularly the RF magnetron sputtering method. This is because RF magnetron sputtering enables ready formation of an AlN or ZnO film of high crystallinity with single c-axis orientation. When AlN is used, it is preferable to adopt reactive RF magnetron sputtering. In this case, an excellent AlN film can be formed by using Al metal for the cathode, introducing Ar and nitrogen gas, and conducting the reactive RF magnetron sputtering at a substrate temperature of around 200° C. A film excellent in crystallinity containing very little impurity can also be fabricated when ECR sputtering is used.

When the functional film 13 is made of a ferroelectric material such as PZT, it is preferably formed by vacuum deposition, sputtering, CVD or laser ablation. Vacuum deposition and sputtering are particularly preferable. The vapor deposition method known as reactive vapor deposition is particularly advantageous in enabling fabrication of a ferromagnetic film of high crystallinity and uniform thickness.

The thickness of the functional film 13 must be appropriately defined in accordance with the type and required characteristics of the electronic device. When the electronic device is to be used as a film bulk acoustic wave resonator, for example, the thickness of the functional film 13 needs to be set thinner in proportion as the resonant frequency is set higher.

Upper Conductive Film 14

The material of the upper conductive film 14 is required to be electrically conductive but is otherwise not particularly limited. The upper conductive film 14 can be formed of a metal such as aluminum (Al), gold (Au) or platinum (Pt), an alloy of these metals and copper (Cu), or the like, or a multilayer film obtained by stacking layers of these metals and titanium (Ti) or the like. The upper conductive film 14 need not necessarily be a film formed by epitaxial growth. In addition, it is preferable to interpose a protective film between the functional film 13 and the upper conductive film 14. Silicon oxide ($SiO_2$) or the like can be used as the material of the protective film.

The upper conductive film 14 is preferably given a thickness of 50 nm to 1 μm. This is because electrical discontinuity or other such defect is likely to occur when the thickness of the upper conductive film 14 is less than 50 nm and the processability of the upper conductive film 14 becomes exceedingly poor at a thickness greater than 1 μm. When the electronic device according to this embodiment is to be used as a film bulk acoustic wave resonator, its resonant frequency varies with the thickness of the upper conductive film 14, similarly as it does with the thickness of the lower conductive film 12. The thickness of the upper conductive film 14 is therefore preferably defined based on the desired resonant frequency.

The foregoing is the composition of the electronic devices 10 and 20, in which the interposition of the crystallinity barrier film 19 between the lower conductive film 12 and the functional film 13 prevents the crystallinity of the functional film 13 being affected by the crystallinity or material selection of the lower conductive film 12. As a result, it is possible to use a low-cost metal such as aluminum (Al) for the lower conductive film 12, and to use a low-cost method for forming the film, thereby making it possible to improve the crystallinity of the functional film 13 without using a costly film-formation method such as epitaxial growth.

An electronic device that is further preferred embodiment of the present invention will now be explained.

Figure 3:
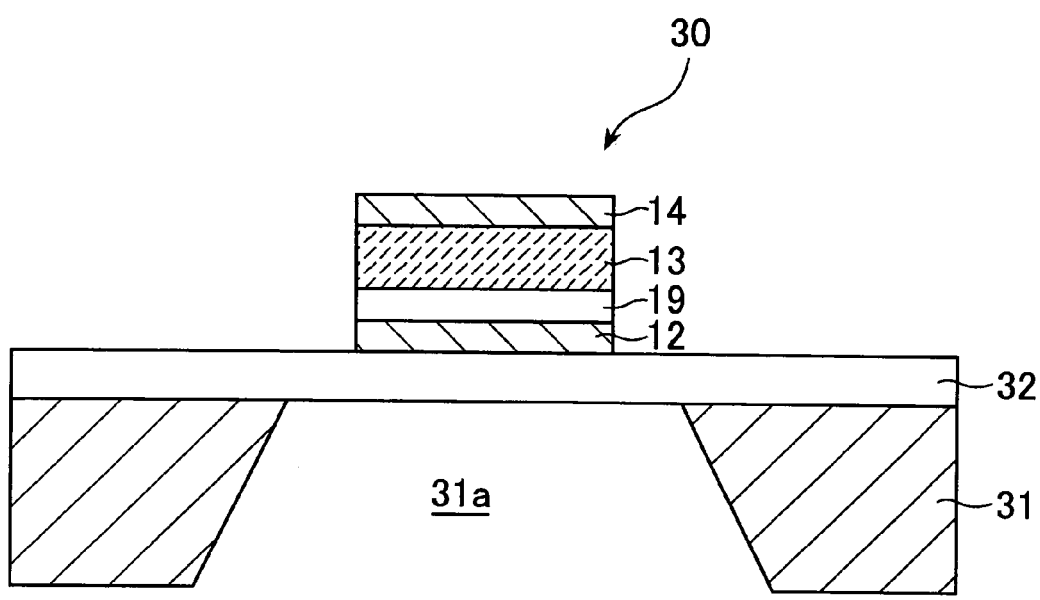
FIG. 3 is a simplified sectional view showing the structure of an electronic device that is another preferred embodiment of the present invention.

FIG. 3 is a simplified sectional view showing the structure of an electronic device 30 that is another preferred embodiment of the present invention.

The electronic device 30 of this embodiment is a film bulk acoustic wave resonator. As shown in FIG. 3, the electronic device 30 comprises a substrate body 31 having a via hole 31a, a buffer layer 32 formed on the substrate 25 body 31, a lower conductive film 12 formed on the buffer layer 32, a crystallinity barrier film 19 formed on the lower conductive film 12, a functional film 13 formed on the crystallinity barrier film 19, and an upper conductive film 14 formed on the functional film 13.

The substrate body 31 is preferably made of single crystal silicon, most preferably of a substrate having a Si (100) single crystal surface. This is because use of a Si (100) substrate facilitates formation of the via hole 31a. The via hole 31a is formed, for example, by removing part of the substrate body 31 by etching or the like or by removing part or all of a once-formed film in the manner of a sacrificial layer or the like. The buffer layer 32 serves as an etching stopper layer when the via hole 31a is formed by etching.

As the electronic device 30 of this embodiment thus has a diaphragm structure configured by forming the via hole 31a in the substrate body 31, it enables provision of a high-performance film bulk acoustic wave resonator.

The present invention has thus been shown and described with reference to specific embodiments. However, it should be noted that the present invention is in no way limited to the details of the described arrangements but changes and modifications may be made without departing from the scope of the appended claims.

WORKING EXAMPLES AND COMPARATIVE EXAMPLES

Here follows a description of working examples of the present invention, but the present invention is in no way limited to these examples.

Example 1

A structure obtained by omitting the upper conductive film 14 from the electronic device 10 of FIG. 1 was fabricated as Example 1 by the following method.

First, a Si (100) substrate 11 of mirror-polished Si single crystal having a thickness of 250 μm and a resistivity of 1000 Ω·cm was prepared and washed. Next, a 100 nm thick lower conductive film 12 of aluminum (Al) was formed on the substrate 11 by RF magnetron sputtering. The lower conductive film 12 was formed at a rate of 1 nm/s with the substrate at room temperature.

Next, RF magnetron sputtering was used to form a 50 nm thick crystallinity barrier film 19 of $SiO_2$ on the lower conductive film 12, using a $SiO_2$ target. The crystallinity barrier film 19 was formed at a rate of 0.1 nm/s with the substrate at room temperature.

Next, RF magnetron sputtering was used to form a 1.8 μm thick functional film 13 of AlN on the crystallinity barrier film 19. The film was formed at a rate of 0.5 nm/s with the substrate at 200° C.

X-ray diffraction testing of the electronic device of Example 1 thus fabricated revealed that while the X-ray rocking curve FWHM of the lower conductive film 12 was 13 degrees, the X-ray rocking curve FWHM of the functional film 13 was 4.2 degrees, confirming that the film crystallinity was relatively high.

Example 2

In Example 2, an electronic device was fabricated in the same way as in Example 1, except that the thickness of the crystallinity barrier film 19 was set at 100 nm. The electronic device of Example 2 thus fabricated was subjected to X-ray diffraction testing, which showed that the X-ray rocking curve FWHM of the functional film 13 was 3.4 degrees, confirming that the film had a relatively high crystallinity.

Example 3

In Example 3, an electronic device was fabricated in the same way as in Example 1, except that the thickness of the crystallinity barrier film 19 was set at 150 nm. The electronic device of Example 3 thus fabricated was subjected to X-ray diffraction testing, which showed that the X-ray rocking curve FWHM of the functional film 13 was 2.9 degrees, confirming that the film had a very high crystallinity.

Example 4

In Example 4, an electronic device was fabricated in the same way as in Example 1, except that the thickness of the crystallinity barrier film 19 was set at 300 nm. The electronic device of Example 4 thus fabricated was subjected to X-ray diffraction testing, which showed that the X-ray rocking curve FWHM of the functional film 13 was 2.9 degrees, confirming that the film had a very high crystallinity.

Example 5

In Example 5, an electronic device was fabricated in the same way as in Example 1, except that the thickness of the crystallinity barrier film 19 was set at 500 nm. The electronic device of Example 5 thus fabricated was subjected to X-ray diffraction testing, which showed that the X-ray rocking curve FWHM of the functional film 13 was 2.8 degrees, confirming that the film had a very high crystallinity.

Comparative Example

In Comparative Example, an electronic device was fabricated in the same way as in Example 1, except that the crystallinity barrier film 19 was omitted so that the functional film 13 was formed on the lower conductive film 12 directly. The electronic device of Comparative Example thus fabricated was subjected to X-ray diffraction testing, which showed that the X-ray rocking curve FWHM of the functional film 13 was 6.9 degrees, confirming that the film had not a good crystallinity.

Figure 4:
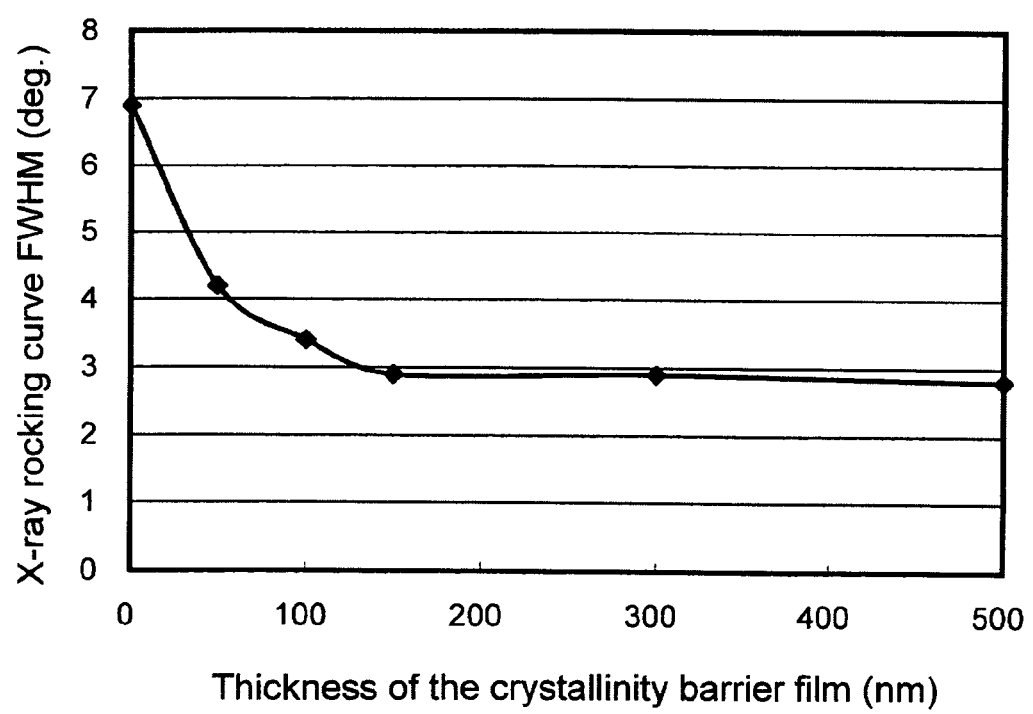
FIG. 4 is a graph showing how the X-ray rocking curve FWHM of a crystallinity barrier film varies with the thickness of a functional film.

FIG. 4 is a graph showing the relationship between the thickness of the crystallinity barrier film 19 and the X-ray rocking curve FWHM of the functional film 13, based on the data on Examples 1 to 5 and the Comparative Example. As can be seen from FIG. 4, in the thickness region of the crystallinity barrier film 19 extending up to less than 150 nm, the X-ray rocking curve FWHM of the functional film 13 decreases as the film thickness increases. However, with respect to a crystallinity barrier film 19 thickness of 150 nm or more, the X-ray rocking curve FWHM was substantially saturated, so no further improvement effect could be observed.

Examples 6 to 10

In each of Examples 6 to 10, an electronic device was fabricated in the same way as in Examples 1 to 5, except that the crystallinity barrier film 19 was formed of $Si_3N_4$, using an Si target and a film-forming rate of 1 nm/s, with the substrate at room temperature. Based on X-ray diffraction testing, the functional film 13 of each of the electronic devices of Examples 6 to 10 was found to have the same X-ray rocking curve FWHM value as that obtained with respect to Examples 1 to 5.

Example 11

In Example 11, an electronic devices having the structure of the electronic device 20 shown in FIG. 2 were fabricated by the following method.

First, a Si (100) substrate body 21 composed of mirror-polished Si single crystal and having a thickness of 250 µm and a resistivity of 1000 Ω·cm was prepared and washed. Next, the acoustic multilayer 22 was formed by repeating four cycles of a process in which a 1.5 µm thick AlN film formed by RF magnetron sputtering and an 0.8 µm thick $SiO_2$ film formed by TEOS-CVD were alternately overlaid in this order. This completed the fabrication of the substrate 11.

Next, a 100 nm thick lower conductive film 12 of aluminum (Al) was formed on the substrate 11 by RF magnetron sputtering. The lower conductive film 12 was formed at a rate of 1 nm/s with the substrate at room temperature. X-ray diffraction testing showed that the lower conductive film 12 thus formed had an X-ray rocking curve FWHM of 15.0 degrees, and a surface roughness Ra of 30 Å.

Next, after the lower conductive film 12 has been patterned in a prescribed configuration, RF magnetron sputtering was used to form thereon a $SiO_2$ crystallinity barrier film 19 having a thickness of 150 nm. The crystallinity barrier film 19 was formed at a rate of 0.1 nm/s with the substrate at room temperature. The crystallinity barrier film 19 thus formed had a surface roughness Ra of 25 Å.

Next, RF magnetron sputtering was used to form an AlN functional film 13 having a thickness of 2.5 µm on the crystallinity barrier film 19. The functional film 13 was formed at a rate of 0.5 nm/s and a substrate temperature of 200° C. On the crystallinity barrier film 19, the functional film 13 thus formed had an X-ray rocking curve FWHM of 2.5 degrees.

In addition, a 50 nm thick protective film of $SiO_2$ was formed on the functional film 13 by the CVD method, and an aluminum (Al) upper conductive film 14 was formed on the protective film by sputtering.

When the characteristics of the electronic device (a film bulk acoustic wave resonator) of Example 11 were measured, it was found to have an impedance ratio (the ratio of the resonance impedance and the antiresonance impedance) of 40 dB and an effective electromechanical coupling factor ($k^2$) of 2.5%, showing that good resonance characteristics were obtained.

The same characteristics were obtained when electronic devices (film bulk acoustic wave resonators) were fabricated in which, instead of aluminum (Al), iron (Fe), chromium (Cr), nickel (Ni), copper (Cu), molybdenum (Mo), silver (Ag), gold (Au) and platinum (Pt) were each used as the lower conductive film 12 material.

What is claimed is:

1. An electronic device, comprising:
    a substrate;
    a lower conductive film provided on the substrate, said lower conductive film having an X-ray rocking curve FWHM of equal to or more than 5 degrees;
    a functional film provided on the lower conductive film, said functional film having an X-ray rocking curve FWHM of equal to or less than 3 degrees; and
    a crystallinity barrier film provided between the lower conductive film and the functional film.

2. The electronic device as claimed in claim 1, wherein a roughness of the lower conductive film is equal to or more than 15 Å.

3. The electronic device as claimed in claim 1, wherein a material of the lower conductive film is aluminum (Al) or copper (Cu), or an alloy thereof.

4. The electronic device as claimed in claim 1, further comprising an upper conductive film formed on the functional film.

5. The electronic device as claimed in claim 1, wherein said crystallinity barrier film is constituted of a material having an amorphous structure.

6. The electronic device as claimed in claim 5, wherein said crystallinity barrier film is constituted of a material containing at least one element selected from among silicon (Si), oxygen (O) and nitrogen (N) or amorphous silicon.

7. The electronic device as claimed in claim 1, wherein a thickness of the crystallinity barrier film is equal to or more than 50 nm.

8. The electronic device as claimed in claim 7, wherein said thickness of the crystallinity barrier film is equal to or more than 150 nm.

9. The electronic device as claimed in claim 1, wherein a thickness of the crystallinity barrier film is equal to or less than a thickness of the functional film.

10. The electronic device as claimed in claim 9, wherein said thickness of the crystallinity barrier film is equal to or less than half the thickness of the functional film.

11. An electronic device, comprising:
    a substrate;
    a lower conductive film provided on the substrate, a roughness of the lower conductive film being equal to or more than 15 Å;
    a functional film provided on the lower conductive film; and
    a crystallinity baffler film provided between the lower conductive film and the functional film, a thickness of the crystallinity barrier film being equal to or more than 50 nm and equal to or less than a thickness of the functional film.

12. The electronic device as claimed in claim 11, wherein said crystallinity barrier film is constituted of a material having an amorphous structure.

13. The electronic device as claimed in claim 12, wherein said crystallinity barrier film is constituted of a material containing at least one element selected from among silicon (Si), oxygen (O) and nitrogen (N) or amorphous silicon.

14. The electronic device as claimed in claim 11, wherein said lower conductive film has an X-ray rocking curve FWHM of equal to or more than 5 degrees and said functional film has an X-ray rocking curve FWHM of equal to or less than 3 degrees.

15. The electronic device as claimed in claim 12, wherein said lower conductive film has an X-ray rocking curve FWHM of equal to or more than 5 degrees and said functional film has an X-ray rocking curve FWHM of equal to or less than 3 degrees.

16. The electronic device as claimed in claim 13, wherein said lower conductive film has an X-ray rocking curve FWHM of equal to or more than 5 degrees and said functional film has an X-ray rocking curve FWHM of equal to or less than 3 degrees.

17. The electronic device as claimed in claim 11, wherein said thickness of the crystallinity baffler film is equal to or more than 150 nm.

18. The electronic device as claimed in claim 11, wherein a material of the lower conductive film is aluminum (Al) or copper (Cu), or an alloy thereof.

19. The electronic device as claimed in claim 11, further comprising an upper conductive film formed on the functional film.

* * * * *

UNITED STATES PATENT AND TRADEMARK OFFICE
CERTIFICATE OF CORRECTION

PATENT NO.        : 7,105,880 B2                                  Page 1 of 1
APPLICATION NO.   : 11/069723
DATED             : September 12, 2006
INVENTOR(S)       : Takao Noguchi et al.

It is certified that error appears in the above-identified patent and that said Letters Patent is hereby corrected as shown below:

Column 10, line 51, replace, "baffler" with -- barrier --.

Signed and Sealed this

Twelfth Day of December, 2006

JON W. DUDAS
*Director of the United States Patent and Trademark Office*